United States Patent
Ishibashi et al.

(10) Patent No.: US 7,371,600 B2
(45) Date of Patent: May 13, 2008

(54) THIN-FILM STRUCTURE AND METHOD FOR MANUFACTURING THE SAME, AND ACCELERATION SENSOR AND METHOD FOR MANUFACTURING THE SAME

(75) Inventors: Kiyoshi Ishibashi, Tokyo (JP); Makio Horikawa, Tokyo (JP); Mika Okumura, Tokyo (JP); Masaaki Aoto, Kumamoto (JP); Daisaku Yoshida, Kumamoto (JP); Hirofumi Takakura, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 135 days.

(21) Appl. No.: 10/344,006

(22) PCT Filed: Jun. 13, 2001

(86) PCT No.: PCT/JP01/04979

§ 371 (c)(1),
(2), (4) Date: Feb. 13, 2003

(87) PCT Pub. No.: WO02/103808

PCT Pub. Date: Dec. 27, 2002

(65) Prior Publication Data

US 2003/0180981 A1 Sep. 25, 2003

(51) Int. Cl.
*H01L 21/00* (2006.01)
*H01L 29/82* (2006.01)

(52) U.S. Cl. .......................................... 438/50; 257/417
(58) Field of Classification Search .................. 438/48, 438/50, 52, 53
See application file for complete search history.

(56) References Cited

U.S. PATENT DOCUMENTS

| | | | | |
|---|---|---|---|---|
| 5,298,436 A | * | 3/1994 | Radosevich et al. | 438/396 |
| 5,476,819 A | * | 12/1995 | Warren | 438/456 |
| 5,550,009 A | * | 8/1996 | Haye et al. | 430/393 |
| 5,550,090 A | | 8/1996 | Ristic | |
| 5,620,931 A | * | 4/1997 | Tsang et al. | 438/50 |
| 5,814,834 A | * | 9/1998 | Yamazaki et al. | 257/59 |
| 5,834,071 A | | 11/1998 | Lin | |
| 5,837,619 A | * | 11/1998 | Adachi et al. | 438/795 |
| 5,922,212 A | * | 7/1999 | Kano et al. | 216/2 |
| 6,199,874 B1 | * | 3/2001 | Galvin et al. | 280/5.514 |
| 6,240,782 B1 | * | 6/2001 | Kato et al. | 73/514.32 |
| 6,286,369 B1 | * | 9/2001 | Yazdi et al. | 73/514.32 |

FOREIGN PATENT DOCUMENTS

| | | |
|---|---|---|
| DE | 44 45 177 | 12/1994 |
| JP | 54-108582 | 8/1979 |
| JP | 09-260745 | 10/1997 |
| JP | 10-261806 | 9/1998 |
| JP | 2000-040830 | 2/2000 |
| JP | 2000-133818 | 5/2000 |
| JP | 2000-183364 | 6/2000 |
| WO | WO 00/42231 | 7/2000 |

* cited by examiner

*Primary Examiner*—Carl Whitehead, Jr.
*Assistant Examiner*—Heather Doty
(74) *Attorney, Agent, or Firm*—Oblon, Spivak, McClelland, Maier & Neustadt, P.C.

(57) ABSTRACT

A thin-film structural body formed by using a semiconductor processing technique and a manufacturing method thereof, and particularly a thin-film structural body constituting a semiconductor acceleration sensor and a manufacturing method thereof. The thin-film structural body allows the thin-film member to be easily stress-controlled, and easily makes the film-thickness of the thin-film member thicker. The thin-film member forms a mass body and, beams and fixed electrodes of the semiconductor acceleration sensor are constituted by a plurality of doped polysilicon thin-films that are laminated by performing a step of film deposition of polysilicon while, for example, phosphorous is being doped as impurities plural times.

9 Claims, 5 Drawing Sheets

F I G . 1
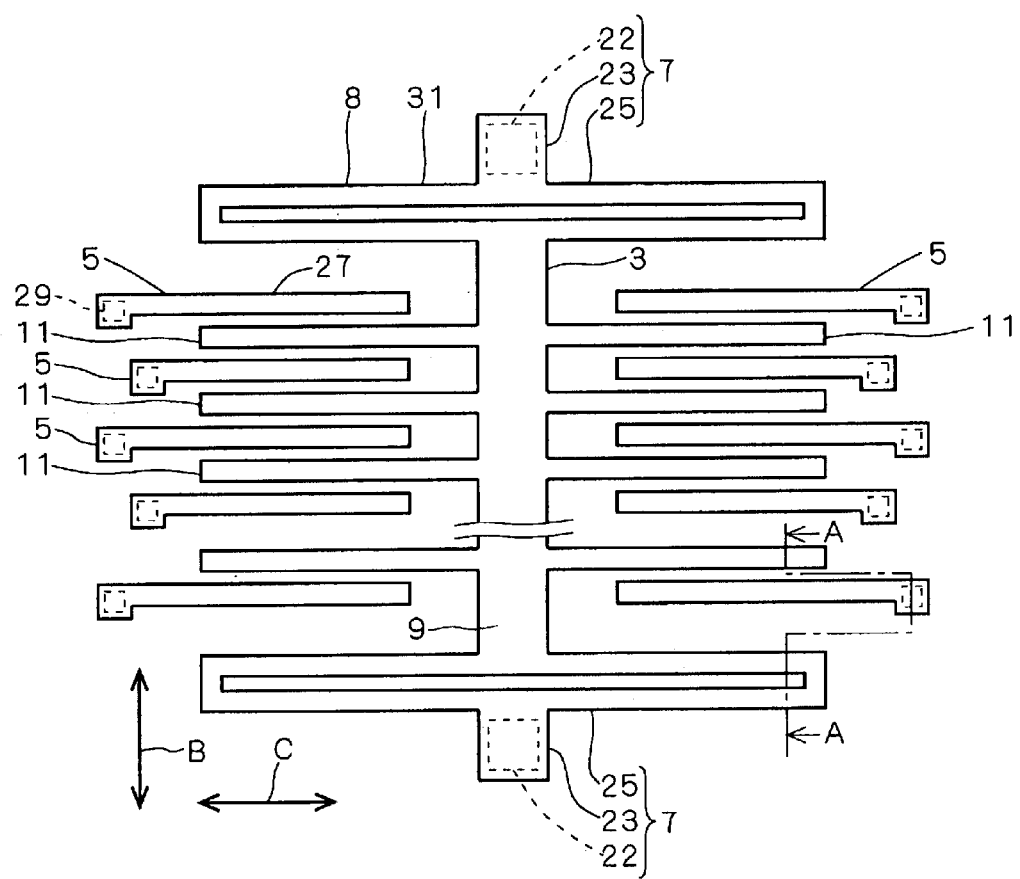

US 7,371,600 B2

THIN-FILM STRUCTURE AND METHOD FOR MANUFACTURING THE SAME, AND ACCELERATION SENSOR AND METHOD FOR MANUFACTURING THE SAME

TECHNICAL FIELD

The present invention relates to a thin-film structural body formed by using a semiconductor processing technique and a manufacturing method thereof as well as a semiconductor acceleration sensor and a manufacturing method thereof.

BACKGROUND ART

In a conventional thin-film structural body, a conductive thin-film member which is placed on a substrate with a gap from the substrate is formed as described below. That is, a polysilicon film which is used for forming a thin-film member is formed on a sacrifice film formed on a substrate through a single film deposition step without doping impurities therein. Subsequently, impurities having a desired conductive type are introduced to the polysilicon film from its surface through an ion injection method or the like, so that the polysilicon film is made to be conductive. Then, the polysilicon film is introduced to a diffusion furnace with the substrate, and after a high-temperature annealing process is carried out on the polysilicon film, the sacrifice film is removed to form the thin-film member.

In above said conventional thin-film structural body, the polysilicon film used for forming the thin-film member is formed through the single film deposition step without doping any impurities therein, and the impurities are then introduced therein from the surface so as to make the polysilicon film conductive; therefore, the impurity concentration tends to become uneven in the thickness direction. This tendency becomes more conspicuous in particular as the film thickness of the polysilicon film becomes thicker. When the impurity concentration becomes uneven in this manner, a residual stress, a stress gradient and the like in the thickness direction tend to generate in the thin-film member to be formed, resulting in deformation and the like in the thin-film member. For this reason, in the conventional thin-film structural body, complex annealing treatment processes are carried out so as to reduce the residual stress, the stress gradient and the like.

In this manner, the conventional thin-film structural body is accompanied with a problem that complex annealing treatment processes are required so as to reduce the residual stress, the stress gradient and the like, and another problem is that it is difficult to make the film thickness of the thin-film member thicker.

DISCLOSURE OF THE INVENTION

The present invention has been made to solve the above-mentioned problems, and an object of the present invention is to provide a thin-film structural body which allows a thin-film member to be easily stress-controlled, and easily makes the film-thickness of the thin-film member thicker and a manufacturing method thereof as well as an acceleration sensor and a manufacturing method thereof.

In a first aspect of a manufacturing method of a thin-film structure of the present invention, the thin-film structural body includes a substrate (1), a conductive thin-film member (8) formed on a sacrifice film (45) formed on the substrate, and allowed to have a predetermined gap from the substrate through the removal of the sacrifice film, and in the manufacturing method thereof, the thin-film member is formed by film deposition of a semiconductor while predetermined impurity is being doped therein.

In accordance with this aspect, the impurity concentration in the thin-film member to be formed is easily controlled in its thickness direction; thus, it becomes possible to easily reduce the residual stress, stress gradient and the like of the thin-film member.

Moreover, it is possible to easily make the film thickness of the thin-film member thicker, while alleviating the residual stress, stress gradient and the like of the thin-film member.

In a second aspect of the manufacturing method of a thin-film structural body of the present invention, upon the film deposition of the semiconductor, a flow rate ratio of the impurity to material gas of the semiconductor is controlled.

In a third aspect of the manufacturing method of a thin-film structural body of the present invention, the thin-film member is constituted by a plurality of layers (33, 35, 51, 53, 55, 57, 61, 63, 65, 67) laminated by carrying out the step of film deposition of the semiconductor a plurality of times, while doping the impurity therein.

In accordance with this aspect, the film deposition conditions of each of the layers constituting the thin-film member, for example, the impurity concentration, film thickness and deposition temperature, can be adjusted independently on demand; thus, it becomes possible to easily reduce the residual stress, the stress gradient and the like of the thin-film member, and consequently to easily obtain a thin-film member having a desired film thickness.

Moreover, with respect to a film-forming device used for forming films of the thin-film member, the film deposition equipment can be used for another film deposition application, if necessary, between film-forming steps of the respective layers; consequently, in comparison with cases in which the thin-film member is deposited at one time, the degree of occupation of the film deposition equipment is lowered so that the equipment can be used more flexibly.

In a fourth aspect of the manufacturing method of a thin-film structural body of the present invention, the thin-film member is subjected to a lamp annealing treatment in a predetermined controlled atmosphere.

In accordance with this aspect, the annealing treatment can be carried out on the thin-film member in a short time, and since the period in which the temperature is unstable is limited to a short time, it is possible to conduct the stress control or the like of the entire thin-film member with higher controllability.

In a fifth aspect of the manufacturing method of a thin-film structure of the present invention, the lamp annealing treatment is carried out in a predetermined controlled atmosphere, each time each of the layers is formed.

In accordance with this aspect, the annealing treatment can be carried out on each of the layers constituting the thin-film member in a short time, and since the period in which the temperature is unstable is limited to a short time, it is possible to conduct the stress control or the like of the entire thin-film member with higher controllability.

Moreover, upon carrying out an annealing treatment on each of the layers constituting the thin-film member, conditions, such as a processing temperature and processing time, can be adjusted independently so that it becomes possible to conduct the stress control or the like of the entire thin-film member with higher controllability.

In a sixth aspect of the manufacturing method of a thin-film structural body of the present invention, each of the films is formed while changing the impurity concentration to form the thin-film member, and the thin-film member is patterned by partially etching the thin-film member so that the cross-sectional shape of a side end face (71) of the thin-film member is set to an irregular shape along the thickness direction of the thin-film member.

In accordance with this aspect, in the thin-film member, it is possible to prevent the side end face from easily sticking to another object that is placed face to face therewith.

Moreover, it is possible to easily form the irregular shape in the cross-sectional shape of the side end face of the thin-film member.

In a first aspect of the manufacturing method of an acceleration sensor in accordance with the present invention, the acceleration sensor includes a sensor substrate (1), a fixed electrode (5) formed on the sensor substrate, a movable electrode (3) and a beam (7) formed on the sensor substrate and having a function of suspending the movable electrode above the sensor substrate movably with a restoring force, and the acceleration sensor is allowed to detect an acceleration based upon the capacity change between the fixed electrode and the movable electrode, and in a method for manufacturing such an acceleration sensor, the fixed electrode, the movable electrode and the beam are formed by using the manufacturing method of the thin-film structural body according to any of claims 1 to 4.

In accordance with this aspect, with respect to the fixed electrode, the movable electrode and the beam to be installed in an acceleration sensor, it becomes possible to alleviate the residual stress and stress gradient in its thickness direction, and consequently to provide a fixed electrode, a movable electrode and a beam that are free from undesired deformation.

In a first aspect of the thin-film structure of the present invention, the thin-film structural body includes a substrate (1) and a conductive thin-film member (8) placed with a predetermined gap from the substrate, and in this structure, the cross-sectional shape of a side end face (71) of the thin-film member is set to an irregular shape along the thickness direction of the thin-film member.

In accordance with this aspect, in the thin-film member, it is possible to prevent the side end face from easily sticking to another object that is placed face to face therewith.

In a second aspect of the thin-film structure of the present invention, the thin-film member (8) is formed by at least one layer of a semiconductor in which impurity is doped.

In a third aspect of the thin-film structural body of the present invention, the thin-film member is formed by laminating a plurality of layers of the semiconductor having different impurity concentration.

In accordance with this aspect, since the amount of etching varies depending on the semiconductor layers having different impurity concentration, it is possible to form the cross-sectional shape of a side end face of the thin-film member into an irregular shape along the thickness direction of the thin-film member upon carrying out the patterning process.

In a first aspect of the acceleration sensor in accordance with the present invention, the acceleration sensor includes a sensor substrate (1), a fixed electrode (5) formed on the sensor substrate, a movable electrode (3) and a beam (7) formed on the sensor substrate and having a function of suspending the movable electrode above the sensor substrate movably with a restoring force, and the acceleration sensor is allowed to detect an acceleration based upon the capacity change between the fixed electrode and the movable electrode, and in this structure, the fixed electrode, the movable electrode and the beam are formed by using the thin-film structural body according to claim 9.

In accordance with this aspect, it becomes possible to prevent each of the portions constituted by the thin-film member, such as the fixed electrode, the movable electrode and the beam, from easily sticking to another object that is placed face to face therewith.

These and other objects, features, aspects and advantages of the present invention will become more apparent in conjunction with the following detailed description and the accompanying drawings.

BRIEF DESCRIPTION OF THE DRAWINGS

FIG. 1 is a plan view showing a configuration of a main part of a semiconductor acceleration sensor in which a thin-film structural body in accordance with one embodiment of the present invention is used.

BEST MODES FOR CARRYING OUT THE INVENTION

1. Embodiment

Figure 2:
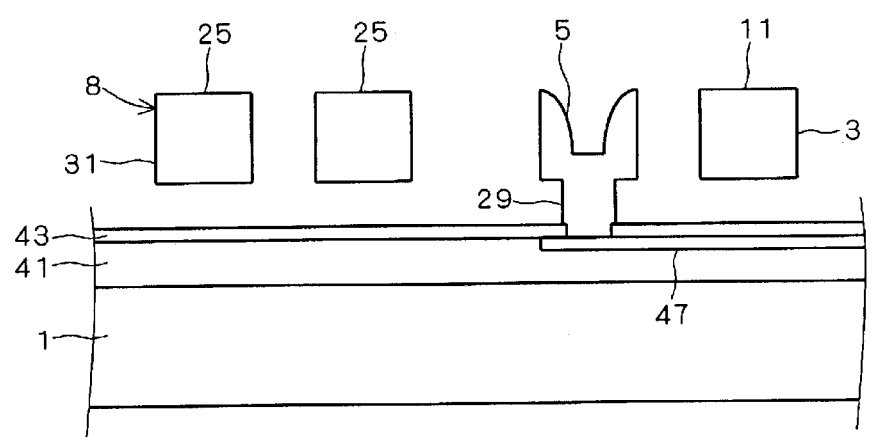
FIG. 2 is a cross-sectional view showing A—A cross-section of FIG. 1.

As shown in FIGS. 1 and 2, a semiconductor acceleration sensor in which a thin-film structural body in accordance with one embodiment of the present invention is used is provided with a substrate (sensor substrate) 1, a mass body 3 which functions as a movable electrode, a plurality of fixed electrodes 5 and a plurality of beams 7. In this case, two beams 7 are installed. The mass body 3, the fixed electrodes 5 and the beams 7 are formed by a conductive thin film 8 placed with a predetermined gap from the substrate 1.

The mass body 3 is provided with a main body portion 9 having a almost square plate shape and a plurality of movable electrode portions 11, which are integrally formed with the main body portion 9. The main body portion 9 is formed along direction B of acceleration to be detected. The movable electrode portions 11 are formed in a manner so as to protrude from both of the edges of the main body portion 9 with respect to width direction C orthogonal to direction B, that is, from the edges on both of the right and left sides in FIG. 1. These movable electrode portions 11 are formed along width direction C with gaps from each other in direction B. The movable electrode portions 11 and the fixed electrode 5 form a capacitor, so that acceleration is detected based upon capacity changes in the capacitor that are generated due to shifts of the movable electrode portions 11.

The beams 7, which are integrally formed with the mass body 3, has a function of suspending the mass body 3 above the substrate 1 movably with a restoring force. In the present embodiment, each of the beams 7 is provided with a support portion 22 formed so as to protrude from the substrate 1, a coupling portion 23 to the support portion 22, and a spring portion 25 placed between the coupling portion 23 and the edge with respect to direction B of the main body portion 9. This spring portion 25 is elastically bent and deformed, so that it is allowed to expand and reduce the distance between the coupling portion 23 and the main body portion 9 along direction B. In the present embodiment, the spring portion 25 is branched sideways from the coupling portion 23 to extend along width direction C and each of the branched portions is bent in a hair-pin curved shape at a position with a predetermined length of extension so that the branched portions extend to the main body portion 9 from both of the sides, and coupled to the edges with respect to directions B of the main body portion 9.

Each of the fixed electrodes 5 has an almost cantilever beam shape and is fixedly secured onto the substrate 1 on both of the sides in width direction C of the mass body 3. Moreover, each of the fixed electrodes 5 is formed along width direction C with predetermined distances from each other in direction B. Above said fixed electrode 5 is provided with a fixed electrode portion 27 placed with a predetermined gap from the substrate 1, and a support portion 29 formed protruding from the substrate 1 to support the fixed electrode portion 27. In this manner, the fixed electrode portion 27 of the respective fixed electrodes 5 and movable electrode portions 11 both of which are placed in parallel with width direction C are alternately arranged with distances with respect to direction B.

When an acceleration is applied to this semiconductor acceleration sensor in direction B, the spring portion 25 of the beam 7 is elastically bent and deformed by an inertia force of the mass body 3, so that the mass body 3 is allowed to shift in direction B with respect to the substrate 1 and the fixed electrodes 5. Thus, the distance between the fixed electrodes 5 and the movable electrode portions 11 of the mass body 3 is changed, so that the capacity of the capacitor constituted by the fixed electrodes 5 and the movable electrode portions 11 is changed. Thus, the acceleration is detected based upon the capacity change in the capacitor.

Figure 3:
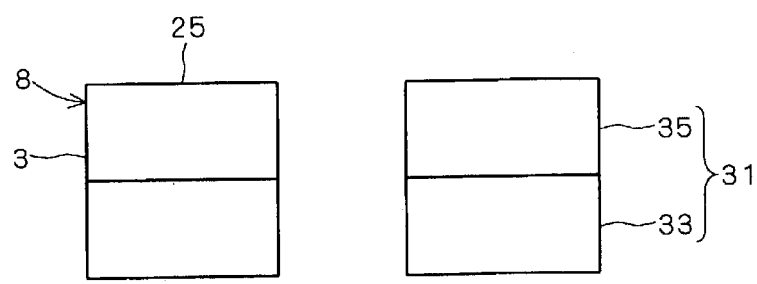
FIG. 3 is a cross-sectional view showing a part of FIG. 2 in an enlarged manner.

Moreover, the thin-film member 8 which constitutes the mass body 3, the beams 7 and the fixed electrodes 5 is formed by a doped polysilicon film 31 which is formed by film deposition of polysilicon serving as a semiconductor while predetermined impurities are doped therein. With respect to the impurities to be doped during the film deposition of the polysilicon, for example, phosphorous is used. The doped polysilicon film 31 is constituted by doped polysilicon thin films that are a plurality of layers laminated by carrying out polysilicon film deposition steps several times with impurities being doped. In the present embodiment, as shown in FIG. 3, the doped polysilicon film 31 is constituted by two doped polysilicon thin films 33, 35. The impurity concentration and the film thickness of the doped polysilicon thin films 33, 35 are set to, for example, the same values. For example, the film thickness of the respective doped polysilicon 33, 35 is set to 2000 nm.

Here, in the present embodiment, the doped polysilicon film 31 is constituted by a plurality of doped polysilicon thin films 33, 35 that are individually formed through a plurality of film deposition steps; however, the doped polysilicon film 31 may be formed through a single film deposition step at one time.

The following description will be given of manufacturing steps of such a semiconductor acceleration sensor, more particular, the thin-film member 8 which constitutes the mass body 3, the beams 7 and the fixed electrodes 5.

Figure 4:
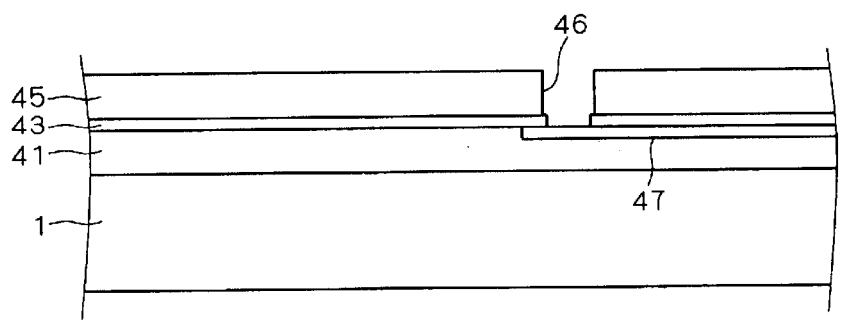
FIGS. 4 to 7 are views showing manufacturing steps of the semiconductor acceleration sensor of FIG. 1.

First, an oxide film 41 made of, for example, SiO$_2$, a nitride film 43 and a sacrifice oxide film 45 are successively formed on the substrate 1 which has been set. A wiring pattern 47 which is selectively formed by polisilicon and the like is formed within the surface of the oxide film 41. Next, on the substrate 1, the nitride film 43 and the sacrifice oxide film 45 are partially removed therefrom at portions where supporting portions for supporting the thin-film member 8 in its floating state above the substrate 1, that is, for example, where the beams 3 and the supporting portions 22, 29 of the fixed electrodes 5 are to be formed. With this arrangement, an anchor hole section 46 is formed as shown in FIG. 4 with the wiring pattern 47 being exposed through the anchor hole 46.

Figure 5:
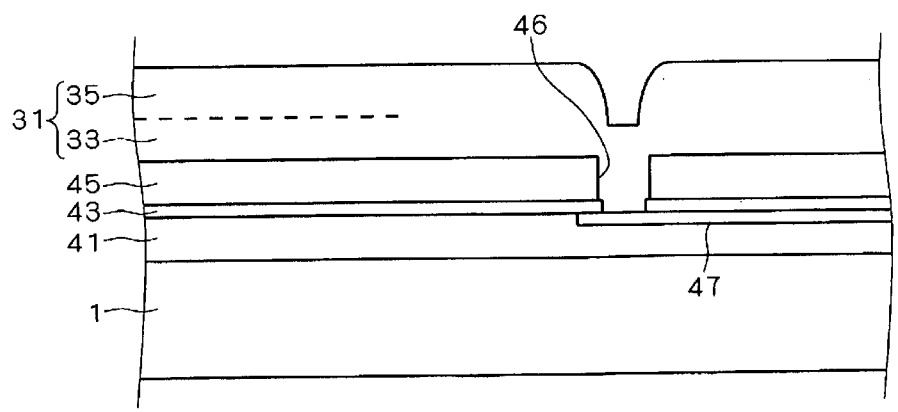

Next, as shown in FIG. 5, the doped polysilicon film 31 is formed on the sacrifice oxide film 45. Upon formation of this doped polysilicon film 31, polysilicon is first deposited on the sacrifice oxide film 45 with, for example, phosphorous being doped as impurities to form a doped polysilicon thin-film 33. Subsequently, this doped polysilicon thin-film 33 is subjected to a lamp annealing treatment in a controlled atmosphere. Then, polysilicon is deposited on the doped polysilicon thin-film 33 with, for example, phosphorous being doped therein as impurities to form a doped polysilicon film 35. Then, this doped polysilicon thin-film 35 is subjected to a lamp annealing treatment under a controlled atmosphere.

Here, the film deposition of each of the doped polysilicon thin-films 33, 35 are carried out in an atmosphere in which silane which is a material gas of polysilicon and phosphorous serving as impurities are mixed. Desirably, phosphorous is mixed at a ratio of $0.5 \times 10^{-3}$ to $5 \times 10^{-3}$ mol with respect to 1 mol of silane. For example, the flow rate mole ratio of phosphorous with respect to silane is set to $1.0 \times 10^{-3}$. In this case, the impurity concentration of the respective doped polysilicon thin-films 33, 35 are set to an equal value.

Here, in the present preferred embodiment, the annealing treatments are carried out individually on the respective doped polysilicon thin-films 33, 35; however, after the two doped polysilicon thin-films 33, 35 are deposited, the annealing treatment may be carried out on the doped polysilicon films 33, 35 at one time.

Figure 6:
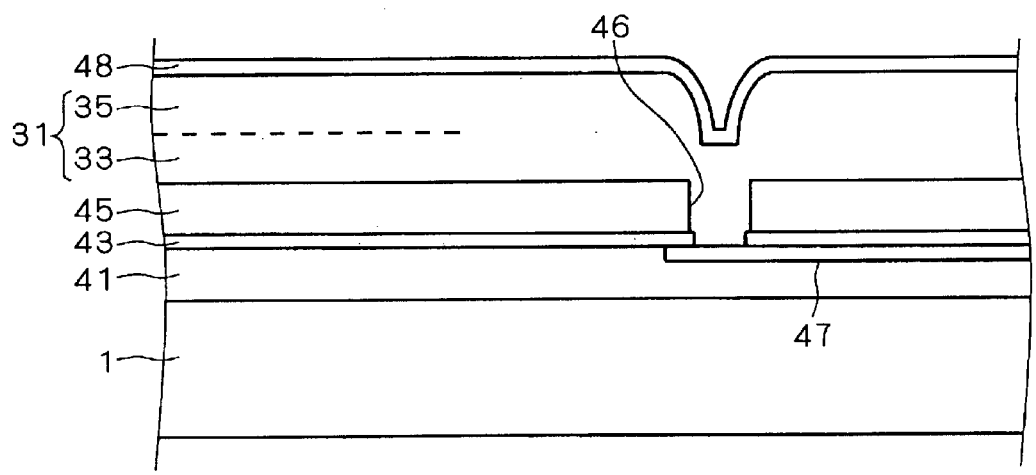
Figure 7:
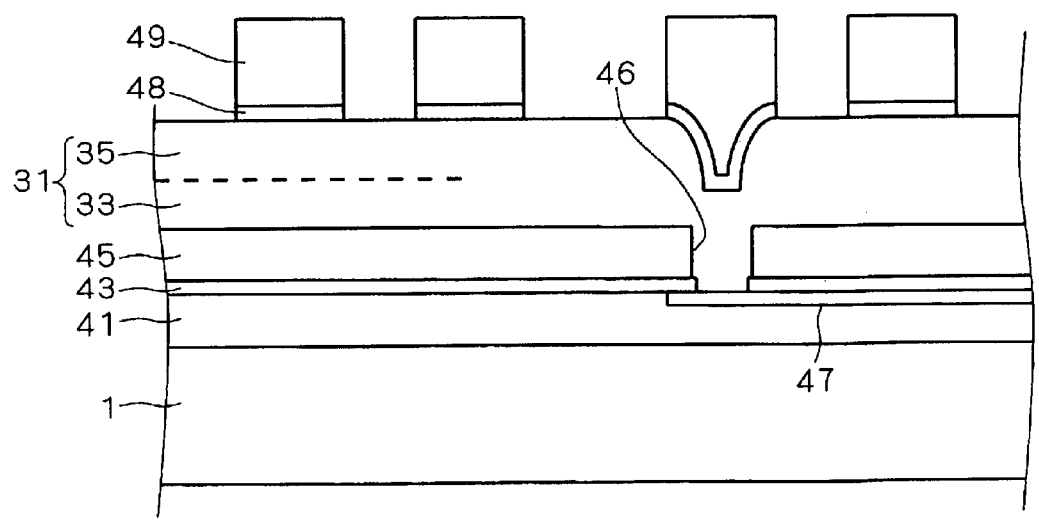

Successively, as shown in FIG. 6, a TEOS (tetraethylorthosilicate) oxide film 48 is formed on the doped silicon film 31. A patterned mask 49 is formed on the TEOS oxide film 48, and the TEOS oxide film 48 is partially removed through an etching process using the mask 49, so that the TEOS oxide film 48 is patterned to provide a structure shown in FIG. 7. Thereafter, the mask 49 is removed. Subsequently, an etching process is carried out by using the patterned TEOS oxide film 48 as a mask so that the doped polysilicon film 31 is partially removed, and patterned.

Next, as shown in FIG. 2, the sacrifice oxide film 41 is removed. Thus, the residual portions of the doped polysilicon film 31 after the patterning process are allowed to form the mass body 3, the beams 7 and the fixed electrodes 5.

Moreover, supporting portions of the thin-film member 8, for example, the supporting portions 22, 29, are formed by portions of the doped polysilicon film 31 that have been fitted into the anchor hole section 46 formed by the sacrifice oxide film 45 and the nitride film 43, and fixedly adhered to the substrate 1.

As described above, in accordance with the present embodiment, the film deposition of the doped polysilicon film 31 is carried out while impurities are being doped therein so that it is easy to control the impurity concentration in the thin-film member 8 constituting the mass body 3, the beams 7 and the fixed electrodes 5, in its thickness direction. Therefore, it becomes possible to easily alleviate the residual stress, the stress gradient and the like of the mass body 3, the beams 7 and the fixed electrodes 5, and consequently to form the mass body 3 and the beams 7 which have no undesired deformations.

Further, it is possible to easily increase the film-thicknesses of the mass body 3, the beams 7 and the fixed electrodes 5 while alleviating the residual stress, the stress gradient and the like thereof.

Moreover, since the annealing treatments to the respective doped polysilicon thin-films 33, 35 are carried out through lamp annealing, so that the period in which the temperature is unstable is limited to a short time, it is possible to carry out the annealing process on the doped polysilicon thin-film in a short time, and also to conduct the stress control or the like of the entire doped polysilicon film 31 with higher controllability.

Furthermore, each time each of the doped polysilicon thin-films 33, 35 is deposited, the lamp annealing treatment is individually carried out on each of the doped polysilicon thin-films 33, 35, so that it is possible to carry out the temperature control in the annealing process on each of the doped polysilicon thin-films 33, 35 individually, and consequently to conduct the stress control or the like of the entire doped polysilicon film 31 with higher controllability.

The present embodiment illustrates a case where the impurity concentration, the film-thickness and the like of each of the doped polysilicon thin-films 33, 35 are equally set; however, the film deposition conditions of each of the doped polysilicon thin-films 33, 35, for example, the impurity concentration, film thickness, deposition temperature and the like, can be adjusted independently on demand; thus, it becomes possible to easily alleviate the residual stress, the stress gradient and the like of the mass body 3, the beams 7 and the beams 5, and consequently to easily obtain the mass body 3, the beams 7 and the fixed electrodes 5 having desired film thickness.

Moreover, with respect to a film deposition equipment used for forming the doped polysilicon thin-film 31 constituting the thin-film member 8, the film deposition equipment can be used for another film deposition application, if necessary, between film deposition processes of the respective doped polysilicon thin-films 33, 35; consequently, in comparison with cases where the doped polysilicon thin-film 31 is deposited at one time, the degree occupation of the film deposition equipment is lowered, so that the equipment can be used more flexibly.

2. Modified Examples

The following description will be given of some modified examples of the above-mentioned semiconductor acceleration sensor. Here, the following modified examples are substantially different from the semiconductor acceleration sensor disclosed in the above-mentioned embodiment 1 in the configuration and manufacturing method of the thin-film member 8 constituting the mass body 3, the beams 7 and the fixed electrodes 5. Therefore, the following description will only be given of the configuration and the manufacturing method of the thin-film member 8.

Figure 8:
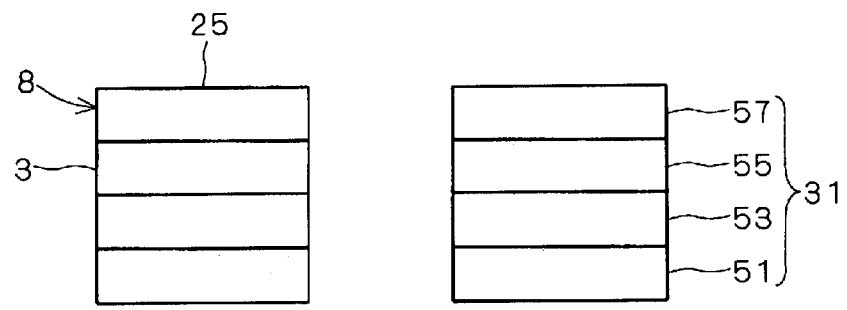
FIG. 8 is a cross-sectional view showing a configuration of a main part of a modified example of the semiconductor acceleration sensor of FIG. 1.

In the modified example shown in FIG. 8, the thin-film member 8, that is, the doped polysilicon film 31, is constituted by four doped polysilicon thin-films 51, 53, 55, 57 that are formed by film deposition of polysilicon while, for example, phosphorous is being doped therein as impurities. The respective doped polysilicon thin-films 51, 53, 55, 57 are individually formed through respectively independent film deposition steps. The film thicknesses of the respective doped polysilicon thin-films 51, 53, 55, 57 are set to the equal value, for example, 1000 nm. Moreover, the phosphorous flow-rate mole ratio with respect to silane upon deposition of the doped polysilicon thin-films 51, 53, 55, 57 is set to, for example, $1.0 \times 10^{-3}$. In this case, the impurity concentration of the respective doped polysilicon thin-films 51, 53, 55, 57 are allowed to be an equal value.

Figure 9:
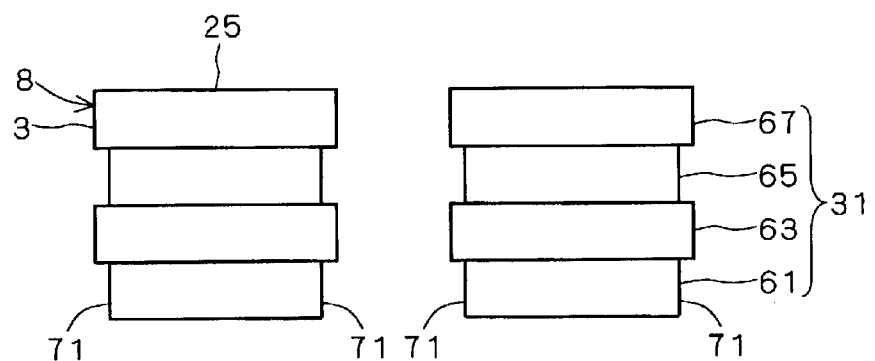
FIG. 9 is a cross-sectional view showing a configuration of a main part of another modified example of the semiconductor acceleration sensor of FIG. 1.

In the modified example shown in FIG. 9, the doped polysilicon film 31 is constituted by four doped polysilicon thin-films 61, 63, 65, 67 that are formed by film deposition of polysilicon while, for example, phosphorous is being doped therein as impurities. The respective doped polysilicon thin-films 61, 63, 65, 67 are individually formed through respectively independent film deposition steps. The impurity concentration of phosphorous in the respective doped polysilicon 61, 63, 65, 67 may be set to different values depending on the respective films 61, 63, 65, 67. For example, the respective doped polysilicon thin-films 61, 63, 65, 67 may be formed, the impurity concentration of which varies in a manner such as small, great, small, great, . . . , or in a manner such as great, small, great, small, . . . , from the lower-layer side.

In this case, in the present modified example, when the doped polysilicon 31 is partially etched, and patterned, the amounts of etching of the side end faces of the respective films 61, 63, 65, 67 are allowed to vary depending on differences in the impurity concentration of the respective doped polysilicon thin-films 61, 63, 65, 67. Therefore, the side end face 71 of the cross-sectional shapes in the thickness direction of the mass body 3, the beams 7 and the fixed electrodes 5 that are formed by residual portions of the doped polysilicon film 31 after the etching process has an irregular shape as shown in FIG. 9.

Thus, in the present modified example, the irregular shape of the side end face 71 makes it possible to prevent the respective portions of the mass body 3, the beams 7 and the fixed electrodes 5 from easily sticking to other objects that face the side end face 71 of each of the portions.

Further, this manufacturing method makes it possible to easily form cross-sectional shapes of the mass body 3, the beams 7 and the fixed electrodes 5.

Moreover, in the modified example of FIG. 9, the film thicknesses of the respective doped polysilicon thin-films 51, 53, 55, 57 may be set to an equal value, such as 1000 nm, or may be set to respectively different values.

Furthermore, the flow-rate mole ratio with respect to silane serving as impurities may be controlled, and changed with time in a single film formation process. With this, the impurity concentration in the doped polysilicon film 31 can be controlled in the thickness direction.

Moreover, another modified example is proposed in which the doped polysilicon film 31 may be constituted by three doped polysilicon thin-films, not shown, each of which is made by film deposition of polysilicon while, for example, phosphorous is being doped as impurities. In this case also, the respective doped polysilicon thin-films are individually formed through respectively independent film deposition steps. Furthermore, the film thicknesses of the respective doped polysilicon thin-films are set to, for example, 700 nm, 1200 nm and 700 nm, in succession from the lower layer side. Upon film deposition of the respective doped polysilicon thin-films, the amounts of blend of phosphorous with respect to silane, represented by the flow-rate mole ratio, are set to, for example, $1.0 \times 10^{-3}$, $1.2 \times 10^{-3}$ and $1.0 \times 10^{-3}$, in succession from the lower layer side.

It is noted that the number of laminated layers, impurity concentration and film thicknesses of the respective doped polysilicon thin-films 33, 35, 51, 53, 55, 57, 61, 63, 65, 67 that constitute the doped polysilicon film 31 shown in the above-mentioned embodiments and the modified examples thereof are shown as examples, and may be adjusted desirably. For example, upon film deposition of the respective doped polysilicon thin-films 33, 35, 51, 53, 55, 57, 61, 63, 65, 67, the amounts of blend of phosphorous with respect to silane, represented by the flow-rate mole ratio, may be desirably set in the range of $0.5 \times 10^{-3}$ to $5 \times 10^{-3}$.

It is noted that, in place of polysilicon, another semiconductor may be adopted, or impurities other than phosphorous may be adopted as impurities to be doped.

While the present invention has been described in detail, the above description is illustrative in all aspects and the present invention is not restricted thereto. It will be understood that numerous variants which are not illustrated can be supposed without departing from the scope of the invention.

What is claimed is:

1. A manufacturing method of an acceleration sensor comprising:

forming a fixed electrode and a beam on a sensor substrate, and a movable electrode suspended by said beam movable above said sensor substrate with a restoring force, wherein said fixed electrode and said movable electrode are configured to detect an acceleration based upon a capacity change therebetween, and said forming includes;

forming a sacrifice on said sensor substrate;

depositing with doping on said sacrifice film a plurality of semiconductor layers having different impurities and different sizes, at least one layer of said semiconductor layers being deposited while being doped, and a cross-section shape of a side end face of said plurality of semiconductor layers has an irregular shape along a direction perpendicular on said plurality of semiconductor layers, the irregular shape comprising a narrow portion disposed between wider portions;

removing said sacrifice film for said movable electrode to have a predetermined gap from said sensor substrate;

patterning the plurality of semiconductor layers; and lamp annealing said movable electrode, said fixed electrode, and said beam.

2. The manufacturing method of an acceleration sensor according to claim 1, wherein the plurality of said semiconductor layers form a laminated structure.

3. The manufacturing method of an acceleration sensor according to claim 1, wherein lamp annealing comprises lamp annealing said plurality of said semiconductor layers, each time each of said semiconductor layers is formed.

4. The manufacturing method of an acceleration sensor according to claim 1, wherein a flow rate ratio of said impurity to material gas of said plurality of said semiconductor layers is controlled in said depositing.

5. A thin-film structural body comprising:

a substrate; and a conductive thin-film member placed with a predetermined gap from said substrate, the thin-film member comprising a plurality of semiconductor layers that have different impurity concentrations and are laminated, wherein a cross-sectional shape of a side end face of said thin-film member has an irregular shape along a thickness direction of said thin-film member, the irregular shape comprising a narrow portion disposed between wider portions.

6. The thin-film structural body according to claim 5, wherein said impurity comprises phosphorus.

7. An acceleration sensor comprising:

a sensor substrate; and a thin-film member including a movable electrode, a fixed electrode formed on said sensor substrate, and a beam formed on said sensor substrate suspending said movable electrode above said sensor substrate movably with a restoring force, the thin-film member comprising a plurality of semiconductor layers that have different impurity concentration and are laminated, wherein said fixed electrode and said movable electrode are configured to detect an acceleration based upon a capacity change therebetween, and a cross-sectional shape of a side end face of said thin-film member has an irregular shape along a thickness direction of said thin-film member, the irregular shape comprising a narrow portion disposed between wider portions.

8. The acceleration sensor according to claim 7, wherein said impurity comprises phosphorus.

9. A manufacturing method of an acceleration sensor comprising:

forming a fixed electrode and a beam on a sensor substrate, and a movable electrode suspended by said beam movable above said sensor substrate with a restoring force, wherein said fixed electrode and said movable electrode are configured to detect an acceleration based upon a capacity change therebetween, and said forming includes:

forming a sacrifice film on said sensor substrate;

depositing a plurality of semiconductor layers on said sacrifice film while doping the semiconductor layers, at least one layer of said semiconductor layers being deposited while being doped, and a cross-section shape of a side end face of said plurality of semiconductor layers has an irregular shape along a direction perpendicular on said plurality of semiconductor layers, the irregular shape comprising a narrow portion disposed between wider portions;

removing said sacrifice film for said movable electrode to have a predetermined gap from said sensor substrate; and lamp annealing said movable electrode, said fixed electrode, and said beam.

* * * * *